(12) United States Patent
Gardner et al.

(10) Patent No.: US 6,191,446 B1
(45) Date of Patent: *Feb. 20, 2001

(54) FORMATION AND CONTROL OF A VERTICALLY ORIENTED TRANSISTOR CHANNEL LENGTH

(75) Inventors: Mark I. Gardner, Cedar Creek; John J. Bush, Leander; Jon D. Cheek, Round Rock, all of TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/035,780

(22) Filed: Mar. 4, 1998

(51) Int. Cl.$^7$ .......................... H01L 29/76; H01L 31/062
(52) U.S. Cl. ............................ 257/330; 257/331; 257/900; 438/270; 438/589
(58) Field of Search .................................. 257/330, 331, 257/332, 328, 329, 900; 438/270, 271, 272, 212, 589, 596, 304, 305, 299

(56) References Cited

U.S. PATENT DOCUMENTS

| | | | |
|---|---|---|---|
| 4,430,791 | 2/1984 | Dockerty | 438/275 |
| 4,498,226 | 2/1985 | Inoue et al. | 438/152 |
| 4,648,937 | 3/1987 | Ogura et al. | 156/643 |
| 4,689,871 | * 9/1987 | Malhi | 438/270 |
| 4,902,637 | 2/1990 | Kondou et al. | 438/152 |
| 4,963,504 | 10/1990 | Huang | 438/305 |
| 5,006,913 | 4/1991 | Sugahara et al. | 257/67 |
| 5,180,680 | * 1/1993 | Yang | 438/259 |
| 5,210,435 | 5/1993 | Roth et al. | 257/344 |
| 5,371,024 | * 12/1994 | hieda et al. | 438/271 |
| 5,470,776 | 11/1995 | Ryou | 438/152 |
| 5,473,181 | 12/1995 | Schwalke et al. | 257/350 |
| 5,492,851 | 2/1996 | Ryou | 438/152 |
| 5,599,738 | 2/1997 | Hashemi et al. | 438/570 |
| 5,612,552 | 3/1997 | Owens | 257/202 |
| 5,640,023 | 6/1997 | Balasinski et al. | 257/66 |

(List continued on next page.)

FOREIGN PATENT DOCUMENTS

| | | |
|---|---|---|
| 58-175853 | 10/1983 | (JP). |
| 6-61481 | 3/1994 | (JP). |

OTHER PUBLICATIONS

Horstmann et al., Characterisation of Sub–100 nm–MOS––Transistors Processed by Optical Lithography and a Sidewall–Etchback Technique, 1996, 4 pgs.

Primary Examiner—Michael Trinh
(74) Attorney, Agent, or Firm—Kevin L. Daffer; Conley, Rose & Tayon

(57) ABSTRACT

A process is provided for forming a transistor in which the channel length is controlled by the depth of a trench etched into a semiconductor substrate. A masking layer extending across the substrate and a portion of the substrate are etched simultaneously to form the trench. A gate dielectric is formed upon the opposed sidewall surfaces of the trench. A pair of gate conductors are then formed upon the exposed lateral surfaces of the gate dielectric and the masking layer. Subsequently, an unmasked region of the substrate underneath the trench is implanted with dopant species and then annealed to form a source junction. The anneal temperature is preferably sufficient to cause the dopant species in the source junction to migrate laterally past the opposed sidewall surfaces of the trench. Drain junctions may subsequently be formed within the substrate a spaced distance above the source region on opposite sides of the trench. The physical channel length of the resulting transistors is thus defined as the distance between a source region and an overlying drain region. The channel of each transistor is spaced laterally from a gate conductor by a gate dielectric.

15 Claims, 4 Drawing Sheets

U.S. PATENT DOCUMENTS

| | | | |
|---|---|---|---|
| 5,667,632 | 9/1997 | Burton et al. | 438/570 |
| 5,672,524 * | 9/1997 | Liu et al. | 148/DIG. 50 |
| 5,723,378 | 3/1998 | Sato | 438/309 |
| 5,808,319 | 9/1998 | Gardner et al. | 257/67 |
| 5,821,591 * | 10/1998 | Krautschneider et al. | 257/329 |
| 5,869,391 | 2/1999 | Manning | 438/618 |
| 5,940,707 * | 8/1999 | Gardner et al. | 438/270 |

* cited by examiner

FORMATION AND CONTROL OF A VERTICALLY ORIENTED TRANSISTOR CHANNEL LENGTH

BACKGROUND OF THE INVENTION

1. Field of the Invention

This invention relates to integrated circuit fabrication and, more particularly, to forming a transistor in which the channel length is controlled by the depth of a trench etched into a semiconductor substrate, wherein the channel is configured between a drain region residing at the substrate surface and a source region arranged at the base of the trench.

2. Description of the Relevant Art

Fabrication of a MOSFET device is well known. Generally speaking, MOSFETs are manufactured by placing an undoped polycrystalline silicon ("polysilicon") material over a relatively thin gate oxide arranged above a semiconductor substrate. The polysilicon material and the gate oxide are patterned to form a gate conductor with source/drain regions (i.e., junctions) adjacent to and on opposite sides of the gate conductor within the substrate. The gate conductor and source/drain regions are then implanted with an impurity dopant. If the dopant species employed for forming the source/drain regions is n-type, then the resulting MOSFET is an NMOSFET ("nchannel") transistor device. Conversely, if the source/drain dopant species is p-type, then the resulting MOSFET is a PMOSFET ("p-channel") transistor device. Integrated circuits utilize either n-channel devices exclusively, p-channel devices exclusively, or a combination of both on a single monolithic substrate.

Because of the increased desire to build faster and more complex integrated circuits, it has become necessary to reduce the transistor threshold voltage, $V_T$. Several factors contribute to $V_T$, one of which is the effective channel length ("Leff") of the transistor. The initial distance between the source-side junction and the drain-side junction of a transistor is often referred to as the physical channel length. However, after implantation and subsequent diffusion of the junctions, the actual distance between junctions becomes less than the physical channel length and is often referred to as the effective channel length. In VLSI designs, as the physical channel length decreases, so too must the Leff. Decreasing Leff reduces the distance between the depletion regions associated with the source and drain of a transistor. As a result, less gate charge is required to invert the channel of a transistor having a short Leff. Accordingly, reducing the physical channel length, and hence the Leff, can lead to a reduction in the threshold voltage of a transistor. Consequently, the switching speed of the logic gates of an integrated circuit employing transistors with reduced Leff is faster, allowing the integrated circuit to quickly transition between logic states (i.e., operate at high frequencies).

Unfortunately, minimizing the physical channel length of a transistor is somewhat limited by conventional techniques used to define the gate conductor of the transistor. As mentioned earlier, the gate conductor is typically formed from a polysilicon material. A technique known as "lithography" is used to pattern a photosensitive film (i.e., "photoresist") above the polysilicon material. An optical image is transferred to the photoresist by projecting a form of radiation, primarily ultraviolet light, through the transparent portions of a mask plate. The solubility of regions of the photoresist exposed to the radiation is altered by a photochemical reaction. The photoresist is washed with a solvent that preferentially removes resist areas of higher solubility. Those exposed portions of the polysilicon material not protected by photoresist are etched away, defining the opposed sidewall surfaces of a polysilicon gate conductor. The lateral width (i.e., the distance between opposed sidewall surfaces) of the gate conductor which dictates the physical channel length of a transistor is thus defined by the lateral width of an overlying photoresist layer. The minimum lateral dimension that can be achieved for a patterned photoresist layer is unfortunately limited by, inter alia, the resolution of the optical system (i.e., aligner or printer) used to project the image onto the photoresist. The term "resolution" describes the ability of an optical system to distinguish closely spaced objects. Diffraction effects may undesirably occur as the radiation passes through slit-like transparent regions of the mask plate, affecting the resolution of the optical system. As such, the features patterned upon a masking plate may not be correctly printed onto the photoresist.

Reducing the Leff of a transistor to below 1.0 $\mu$m may lead to deleterious short channel effects ("SCE"). Generally speaking, SCE impacts device operation by, for example, increasing sub-threshold currents. A problem related to SCE and the subthreshold currents associated therewith, but altogether different, is the problem of hot-carrier effects ("HCE"). HCE is a phenomena by which the kinetic energy of the charge carriers (holes or electrons) is increased as the carriers are accelerated through large potential gradients and subsequently become trapped within the gate oxide. The greatest potential gradient, often referred to as the maximum electric field ("Em"), occurs near the drain during saturated operation of a transistor. More specifically, the electric field is predominant at the lateral junction of the drain adjacent the channel. As hot electrons travel to the drain, they lose their energy by a process called impact ionization. Impact ionization serves to generate electron-hole pairs which migrate to and become injected within the gate dielectric near the drain junction. Vacancy and interstitial positions within the gate dielectric generally become electron traps, resulting in a net negative charge density within the gate dielectric. Unfortunately, the trapped charge may accumulate over time, causing the transistor threshold voltage to undesirably shift from its design specification.

To overcome the problems related to HCE, an alternative drain structure known as the lightly doped drain ("LDD") has grown in popularity. The LDD structure advantageously absorbs some of the potential into the drain and thus reduces Em. A conventional LDD structure is one in which a light concentration of dopant is self-aligned to the gate conductor followed by a heavier concentration of dopant self-aligned to the gate conductor on which two sidewall spacers have been formed. The purpose of the first implant dose is to produce a lightly doped section (i.e., an LDD area) at the gate edge immediately adjacent the channel. The second implant dose forms a heavily doped source/drain region spaced from the channel a distance dictated by the thickness of the sidewall spacer. A dopant gradient (i.e., "graded junction") therefore results at the interface between the LDD area and the channel as well as between the LDD area and the source/drain region. The addition of an LDD implant adjacent the channel unfortunately adds capacitance and resistance to the source/drain pathway. This added resistance, generally known as parasitic resistance, can have many deleterious effects. For example, parasitic resistance can decrease the saturation drive current and the overall speed of the transistor. While it would seem beneficial to decrease both the drain-side parasitic resistance $R_D$ and the source-side parasitic resistance $R_S$, the drain-side parasitic resistance is nonetheless needed to minimize HCE. Accordingly, proper LDD design must take into account the need for minimizing parasitic resistance at the source-side while at the same time attenuating Em at the drain-side of the channel.

It would therefore be desirable to develop a transistor fabrication technique in which the channel length of the transistor is reduced to provide for high frequency operation of an integrated circuit employing the transistor. More specifically, a process is needed in which the channel length is no longer dictated by the resolution of a lithography optical aligner. Thus, the Leff of a transistor must no longer be mandated by the lateral width of a lithographically patterned gate conductor. While minimizing Leff might afford high frequency operation of a transistor, it could also give rise to deleterious drain-side hot carrier injection into the gate dielectric. It would therefore be of benefit to develop an LDD design which serves to attenuate the maximum electric field Em in the critical drain area while reducing parasitic resistance $R_S$ in the source area. Such an LDD design would allow Leff to be reduced without being concerned that the transistor might experience problems associated with HCE and SCE as well as a reduction in saturation drive current.

SUMMARY OF THE INVENTION

The problems outlined above are in large part solved by the technique hereof for fabricating a transistor in which the channel length is controlled by the depth of a trench etched into a semiconductor substrate. A masking layer extending across the substrate and a portion of the substrate are etched simultaneously to form the trench. As such, opposed sidewall surfaces of the trench are aligned to opposed lateral surfaces of the masking layer. A gate dielectric is formed upon the opposed sidewall surfaces of the trench. A pair of gate conductors are then formed upon the surfaces of the gate dielectric adjacent the sidewall of the trench and also upon the masking layer sidewalls. Subsequently, an unmasked region of the substrate underneath the trench is implanted with dopant species and then annealed. In this manner, a source junction is formed which is to be mutually shared by a pair of ensuing series-connected transistors of, e.g., a multiple input logic device. The anneal temperature is preferably sufficient to cause the dopant species in the source junction to migrate laterally past the opposed sidewall surfaces of the trench.

After removing at least a portion of the masking layer, an LDD implant which is self-aligned to the opposed sidewall surfaces of the gate conductors may be forwarded into regions of the substrate. As a result, LDD areas of a pair of transistors may be formed laterally adjacent the trench sidewalls a spaced distance above the mutually shared source junction. Thereafter, dielectric sidewall spacers may be formed upon the opposed sidewall surfaces of the gate conductors. A heavily doped drain implant which is self-aligned to the exposed lateral surfaces of the dielectric sidewall spacers may then be forwarded into the substrate to form heavily doped drain regions spaced from the trench by a distance equivalent to the thickness of each dielectric sidewall spacer. The physical channel length of each transistor is thus defined as the distance between a portion of the source region extending laterally beyond the trench and the drain region arranged directly above that portion of the source region. The channel of each transistor is oriented vertically between source and drain junctions and is spaced laterally from a gate conductor by a gate dielectric. Since the source region is formed directly underneath the trench, the depth of the trench dictates the physical channel length.

Advantageously, the depth to which the trench is etched may be controlled to scale the channel length to its desired value. The trench may be etched using a dry, plasma technique. As such, the etch duration may be selected to terminate after a pre-defined amount of the substrate has been removed. Therefore, the trench depth may be varied by changing the duration of the etch used to form the trench. Absent the need to use lithography to define the depth of the trench, the physical channel length is not limited by the resolution of an optical system. Decreasing the depth of the trench thus provides for minimization of the physical channel length, and hence the Leff. The reduction in Leff affords high speed operation of the series-connected transistors.

The problems typically associated with reducing Leff are alleviated by the asymmetrical configuration of the present transistors. That is, LDD areas are purposefully formed solely in the drain junctions between the channel and the heavily doped drain regions while the source junction proximate the channel is maintained absent of an LDD area. Although an LDD implant is forwarded into the source junction proximate the channel, a high concentration of dopant species already exists within the source junction before the LDD implant. As such, the light concentration of dopant species provided to the source junction by the LDD implant only slightly increases the concentration of dopant species within the source junction. Therefore, the source junction remains a heavily doped source region which does not include a lightly doped LDD area, despite being subjected to the LDD implant. In contrast to the source junction, the drain junctions into which the LDD implant is also forwarded includes no pre-existing dopant species. Further, portions of the drain junctions subjected to the LDD implant (adjacent the trench sidewalls) are masked from being exposed to a subsequent heavily doping drain implant by spacers formed upon the sidewall surfaces of the gate conductors. Therefore, a light concentration of dopant species is maintained in those masked portions such that the drain junctions include an LDD area laterally adjacent the trench sidewalls. The resulting drain-engineered structure serves to attenuate the maximum electric field Em in the critical drain area while reducing parasitic resistance $R_S$ proximate the source area. Thus, the electric field Em is shifted only where necessary, i.e. near the drain-side of each channel. As a result of the present LDD design, the transistors receive the benefit of reduced HCE but not at the expense of performance (i.e., switching speed or saturation drive current). Even when Leff is less than 1.0 $\mu$m, where SCE would normally be a problem, the present LDD-embodied transistors experience minimal sub-threshold currents.

An embodiment of the present invention contemplates providing a lightly doped silicon-based substrate across which a masking layer is arranged. The masking layer may include any material which can inhibit ions from passing to the underlying substrate during subsequent ion implantation steps. Preferably, the masking layer is also a material through which ambient oxygen cannot easily penetrate to the underlying substrate. The masking layer may, e.g., be a silicon nitride ("nitride") layer arranged upon a silicon dioxide ("pad oxide") layer. Both the nitride layer and the oxide layer may be deposited above the substrate using chemical-vapor deposition ("CVD"). Subsequently, the masking layer and the substrate may be etched using a plasma etch technique to define a trench within the substrate having opposed sidewall surfaces aligned to opposed lateral surfaces of the masking layer. The duration of the etch is terminated after a pre-defined amount of the trench has been removed to control the depth of the trench. The trench may, for example, extend to a depth of between 0.1 to 0.5 micron within the substrate. Thereafter, a gate dielectric, preferably a thermally grown oxide, may be formed at the periphery of the trench. The gate dielectric may also be composed of other materials, e.g., silicon oxyfluoride, which exhibit a relatively low dielectric constant, K. The masking layer serves to inhibit oxidation of the underlying substrate surface.

A gate conductor material, preferably polysilicon, is then deposited across the masking layer and the gate dielectric. The gate conductor material may also include other semiconductive or conductive materials, such as tungsten and titanium. The gate conductor material is anisotropically etched to form a pair of spacer-like gate conductors upon the lateral surfaces of the masking layer and the gate dielectric. Anisotropic etch involves ion ablation of horizontally oriented surfaces at a faster rate than vertically oriented surfaces. As a result of the anisotropic etch, the gate conductor material is removed primarily from horizontally oriented surfaces and retained upon the vertically oriented surfaces of the masking layer and the gate dielectric. The lateral thickness or width of the gate conductors may be controlled by varying the etch duration. Dopant species may be implanted at a relatively high dose and energy into a region of the substrate underlying the trench before or after the formation of the gate conductors. The dopant species may then be annealed at a temperature sufficient to cause lateral migration of the dopant species beyond the trench sidewall surfaces, thereby forming a heavily doped source junction.

The masking layer thickness is then at least partially reduced to expose sidewall surfaces of the gate conductors. Subsequently, an LDD implant which is self-aligned to the opposed sidewall surfaces of the gate conductors may be forwarded into the substrate at a relatively low dose and energy. The resulting LDD regions are arranged near the upper surface of the substrate on opposite sides of the trench. Dielectric sidewall spacers are then formed upon the opposed sidewall surfaces of the gate conductor. Another implant which is self-aligned to the exposed lateral surfaces of the dielectric sidewall spacers may then be performed at a higher dose and energy than the LDD implant to form heavily doped drain regions. The energy of this implant, however, is somewhat limited by the need to maintain separation between the drain junctions and the underlying source junction.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

Figure 1:
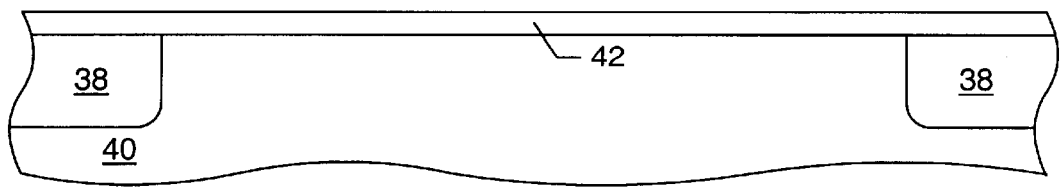
FIG. 1 is a partial cross-sectional view of a semiconductor topography, wherein an pad oxide layer is formed across a semiconductor substrate.
Figure 2:
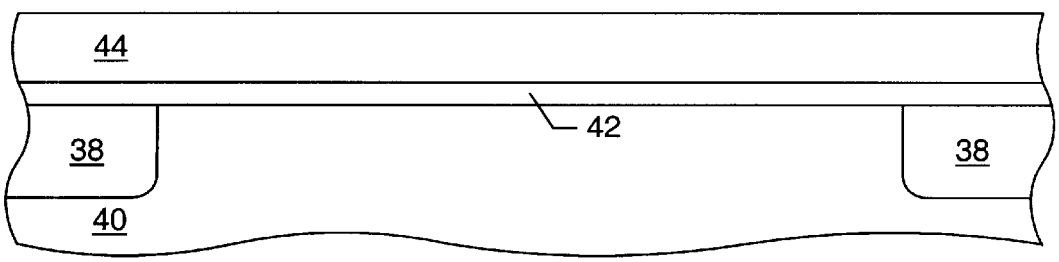
FIG. 2 is a partial cross-sectional view of the semiconductor topography, wherein a nitride layer is deposited across the pad oxide layer, subsequent to the step in FIG. 1.

Turning now to FIG. 1, a partial cross-sectional view of a semiconductor substrate 40 is depicted. Substrate 40 preferably comprises single crystalline silicon which has been slightly doped with n-type or p-type impurities. Dielectric isolation regions, such as shallow trench isolation structures 38, are arranged spaced distances apart within substrate 40 for dielectrically isolating ensuing active areas. The dielectric isolation regions may alternately include well known LOCOS structures. In an alternate embodiment, p-type and n-type wells may be arranged within select regions of substrate 40 to allow for the formation of a CMOS integrated circuit which includes both NMOSFET and PMOSFET transistors. A pad oxide layer 42 is formed across semiconductor substrate 40 using, e.g., CVD of oxide from a silane- and oxygen-bearing gas. As shown in FIG. 2, a nitride layer 44 may be CVD deposited across pad oxide layer 42 from, e.g., a silane- and ammonia-bearing gas. Pad oxide layer 42 serves to reduce the inherent stresses which normally exist between nitride and silicon. Nitride layer 44 in combination with pad oxide layer 42 may serve as a masking layer during subsequent ion implantation steps.

Figure 3:
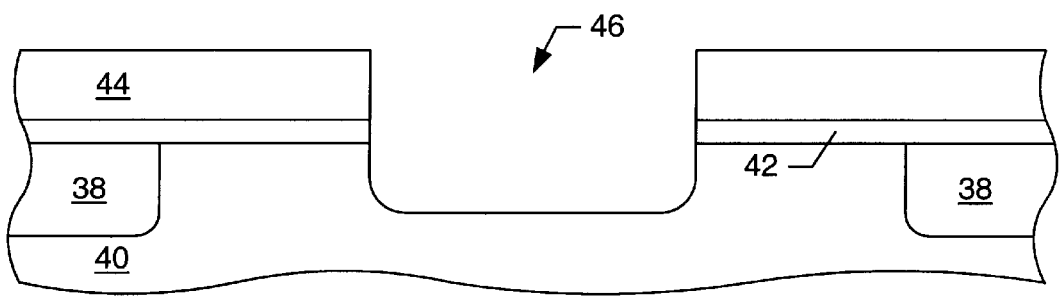
FIG. 3 is a partial cross-sectional view of the semiconductor topography, wherein portions of the nitride layer, the oxide layer, and the substrate are etched to define a trench within the substrate, subsequent to the step in FIG. 2.
Figure 4:
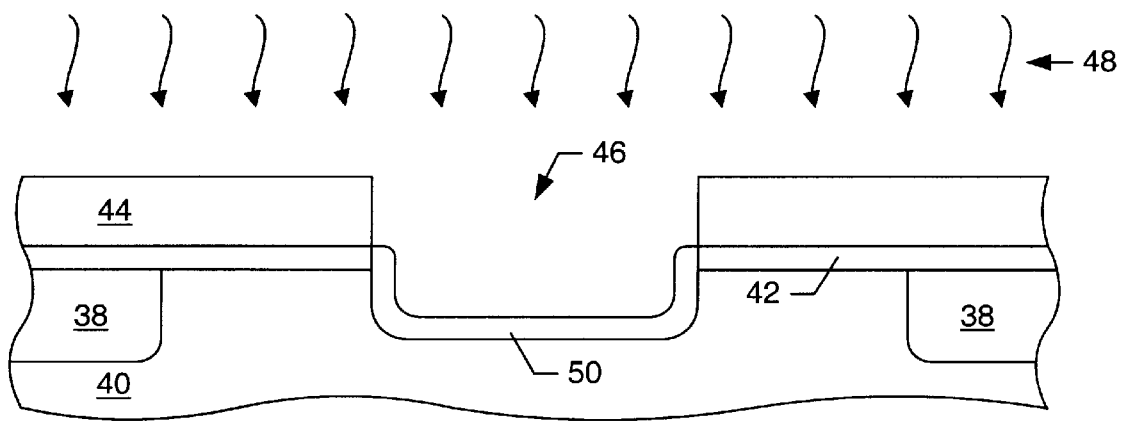
FIG. 4 is a partial cross-sectional view of the semiconductor topography, wherein a gate oxide is thermally grown upon exposed silicon surfaces at the periphery of the trench, subsequent to the step in FIG. 3.

Turning to FIG. 3, portions of nitride layer 44, pad oxide layer 42, and substrate 40 are then etched to form a trench 46 within substrate 40. Photolithography is used to define the region of substrate 40 which is etched. The etch technique is preferably a dry, plasma etch in which the etch duration is selected to terminate after a pre-defined thickness of the substrate has been removed. The depth of the resulting trench may be, e.g., 0.1 to 0.5 micron. The opposed sidewall surfaces of trench 46 are aligned with the opposed lateral surfaces of nitride layer 44. FIG. 4 illustrates a gate dielectric 50 being formed upon the exposed surfaces of silicon-based substrate 40 to thermal radiation 48 in, e.g., an oxygen-bearing ambient. While gate dielectric 50 is preferably a thermally grown oxide, it may also be other low K dielectric materials. The orientation of the crystal lattice planes at the corner regions of trench 46 affords enhanced oxide growth upon the opposed sidewall surfaces of trench 46. Nitride layer 44 substantially inhibits ambient oxygen from penetrating to and oxidizing underlying regions of substrate 40.

Figure 5:
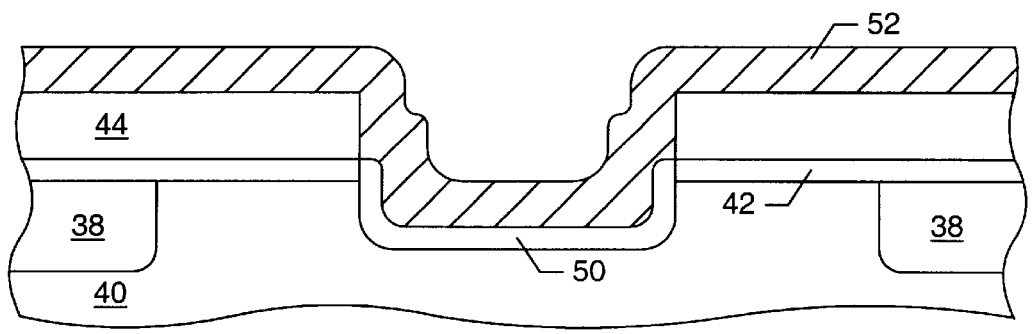
FIG. 5 is a partial cross-sectional view of the semiconductor topography, wherein a polysilicon layer is deposited across the nitride layer and the gate oxide, subsequent to the step in FIG. 4.
Figure 6:
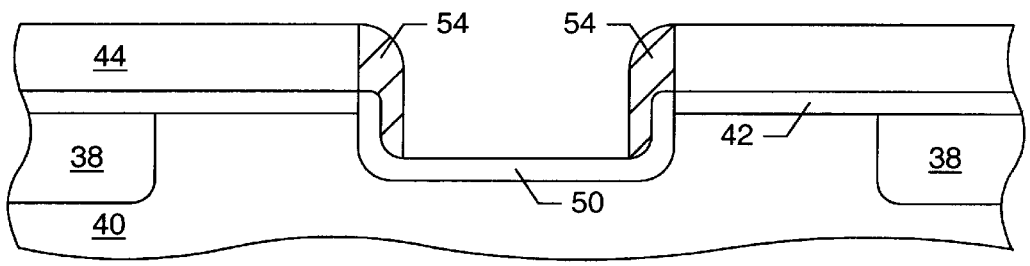
FIG. 6 is a partial cross-sectional view of the semiconductor topography, wherein the polysilicon layer is anisotropically etched to form gate conductors upon the lateral surfaces of the nitride layer and the gate oxide, subsequent to the step in FIG. 5.

FIG. 5 depicts the CVD of a gate conductor material 52 across exposed surfaces of the semiconductor topography. Gate conductor material 52 is preferably composed of polysilicon and thus may be deposited from, e.g., a silane source. It is to be understood that gate conductor material 52 may also be composed of other semiconductive or conductive materials, such as tungsten, aluminum, or titanium. If the gate conductor material 52 is polysilicon, it may be rendered conductive by implanting impurities into the polysilicon during later processing steps. As depicted in FIG. 6, gate conductor material 52 is then anisotropically etched to form a pair of gate conductors 54 upon the lateral surfaces of gate dielectric 50 and nitride layer 44.

Figure 7:
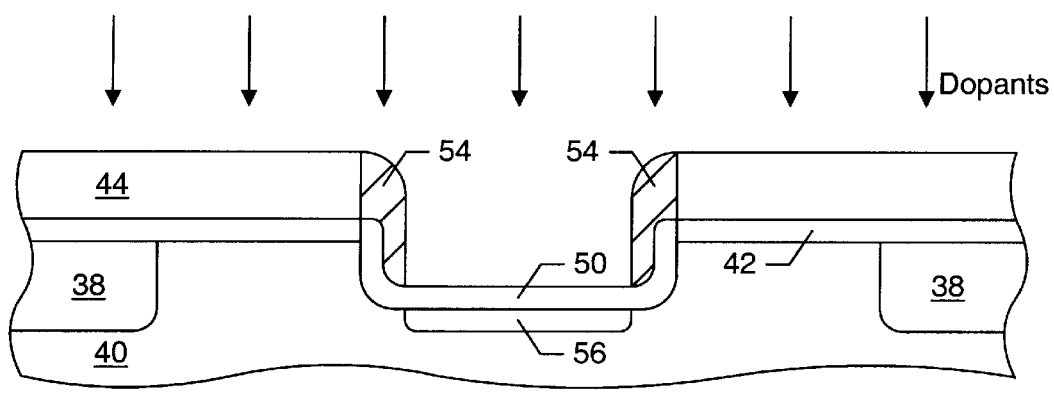
FIG. 7 is a partial cross-sectional view of the semiconductor topography, wherein dopant species are implanted into the substrate to form a source region underneath the trench, subsequent to the step in FIG. 6.
Figure 8:
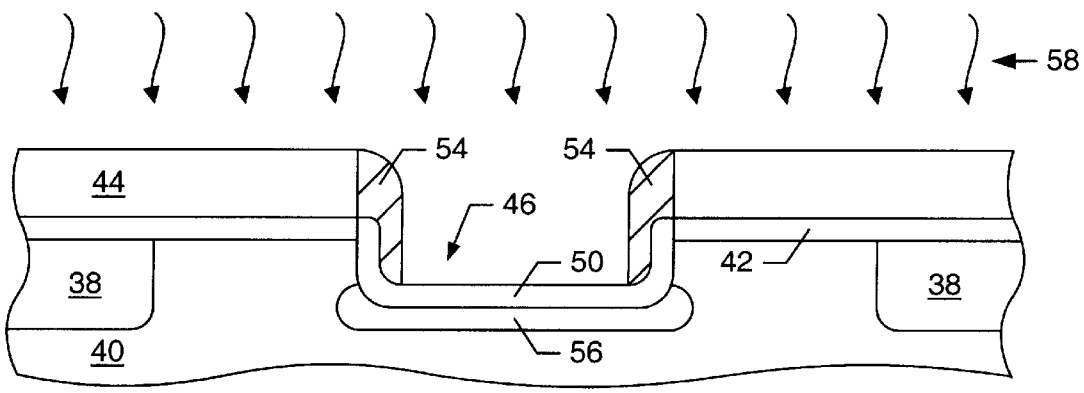
FIG. 8 is a partial cross-sectional view of the semiconductor topography, wherein the substrate is annealed at a temperature sufficient to cause lateral migration of the source region beyond the opposed lateral surfaces of the trench, subsequent to the step in FIG. 7.

Turning to FIG. 7, dopant species are then implanted at a relatively high dose and energy into an unmasked region of substrate 40 which is aligned between exposed lateral surfaces of gate conductors 54 to form a source region 56. If a PMOS integrated circuit is being fabricated, p-type species are implanted, and if an NMOS integrated circuit is being formed, n-type species are implanted. Optionally, a CMOS integrated circuit containing both PMOSFET and NMOSFET devices may be formed by masking the active areas (i.e., those areas in which transistors are to be formed) of substrate 40 which are to contain one type of dopant species while implanting the other type of dopant species into unmasked active areas, followed by the opposite procedure. Some commonly used n-type dopants are arsenic or phosphorus, and some commonly used p-type dopants are boron or boron difluoride. As shown in FIG. 8, a post-implant anneal using thermal radiation 58 may be performed to activate and position the as-implanted impurities. The temperature of the anneal is preferably sufficient to cause lateral migration of the impurities beyond the opposed sidewall surfaces of trench 46. The extent of migration of the impurities may be increased by using a dopant species having a relatively high diffusivity, such as boron. Portions of the resulting source region 56 are thus spaced from the upper surface of substrate 40. Source region 56 may subsequently be used as a mutual junction of ensuing series-connected transistors.

Figure 9:
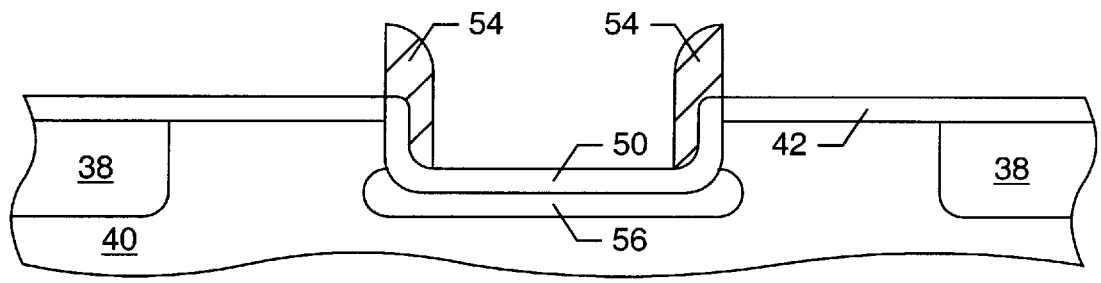
FIG. 9 is a partial cross-sectional view of the semiconductor topography, wherein the nitride layer is removed from above the substrate, subsequent to the step in FIG. 8.
Figure 10:
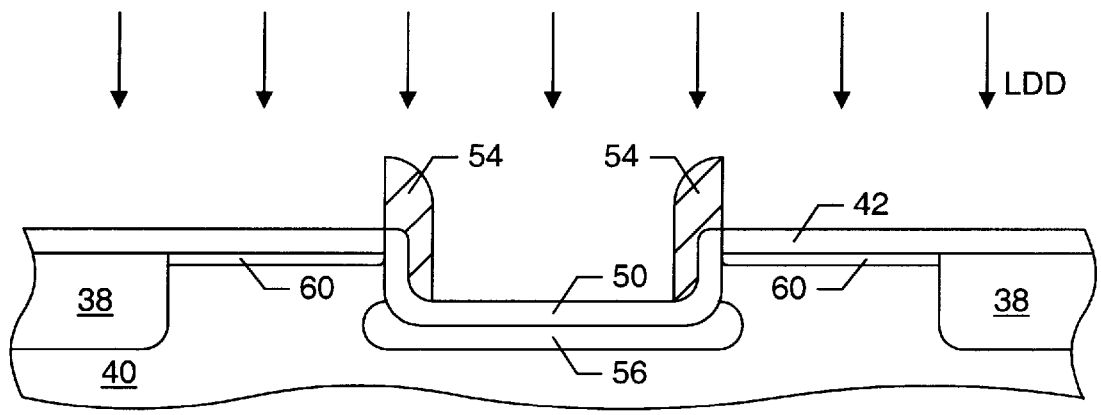
FIG. 10 is a partial cross-sectional view of the semiconductor topography, wherein an LDD implant self-aligned to the opposed sidewall surfaces of the gate conductors is performed to form LDD areas a spaced distance above the source region, subsequent to the step in FIG. 9.
Figure 11:
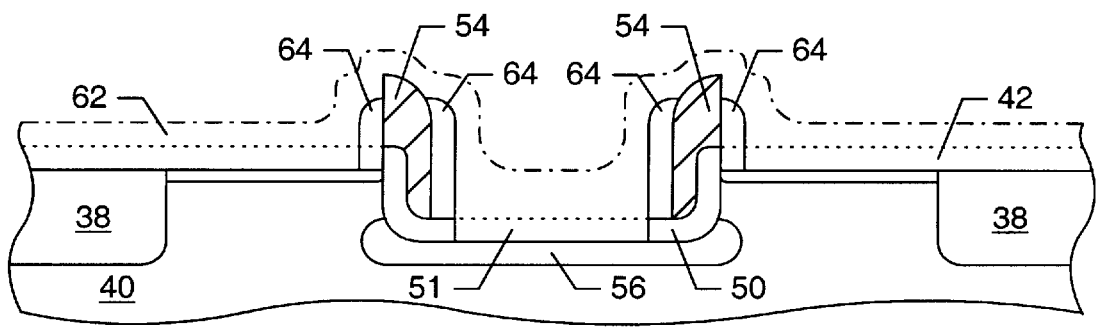
FIG. 11 is a partial cross-sectional view of the semiconductor topography, wherein sidewall spacers are formed upon opposed sidewall surfaces of the gate conductors, subsequent to the step in FIG. 10.
Figure 12:
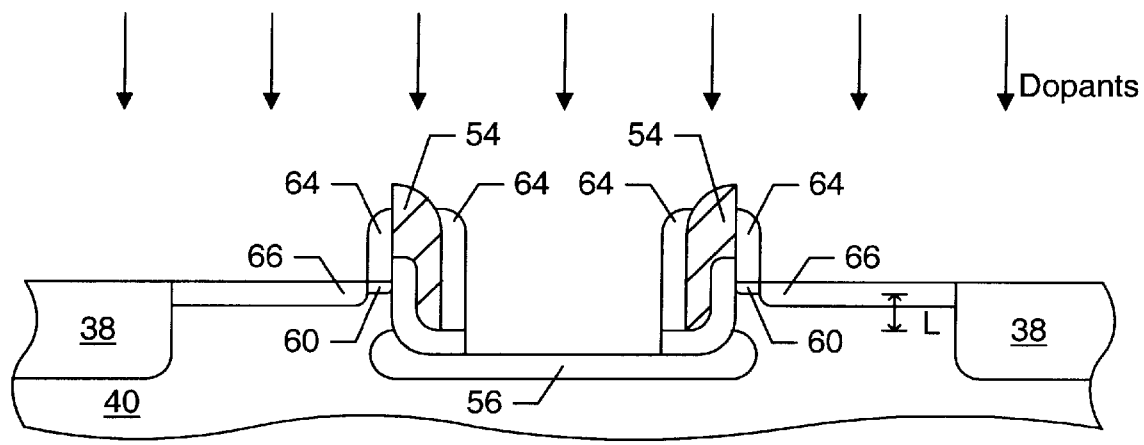
FIG. 12 is a partial cross-sectional view of the semiconductor topography, wherein another implant of dopant species which is self-aligned to the exposed lateral surfaces of the dielectric sidewall spacers is forwarded into the substrate to form heavily doped drain regions, subsequent to the step in FIG. 11.

As shown in FIG. 9, nitride layer 44 may then be stripped using, e.g., an etch technique which exhibits high selectivity to nitride relative to oxide and polysilicon. Turning to FIG. 10, an LDD implant which is self-aligned to the opposed sidewall surfaces of gate conductors 54 may then be forwarded into substrate 40 at a relatively low concentration and energy. The dopant species used for the LDD implant is the same type of species as the one used to form source region 56. LDD areas having a relatively shallow depth are thus formed between gate conductors 54 and trench isolation structures 38 proximate the upper surface of substrate 40. FIG. 11 depicts the formation of dielectric sidewall spacers 64 upon the exposed sidewall surfaces of gate conductors 54. Sidewall spacers 64 may be formed by depositing a dielectric material, e.g., oxide or nitride, across the semiconductor topography. The dielectric material may then be anisotropically etched to remove a portion 62 of the dielectric material from horizontally oriented surfaces while retaining spacers 64 upon lateral surfaces. Pad oxide layer 42 and a portion 51 of gate dielectric 50 may serve as an etch stop during the anisotropic etch step, and thus may be partially removed from substrate 40. The remainder of portion 51 of gate dielectric 50 may then be completely removed from substrate 40 in a subsequent etching step.

Figure 13:
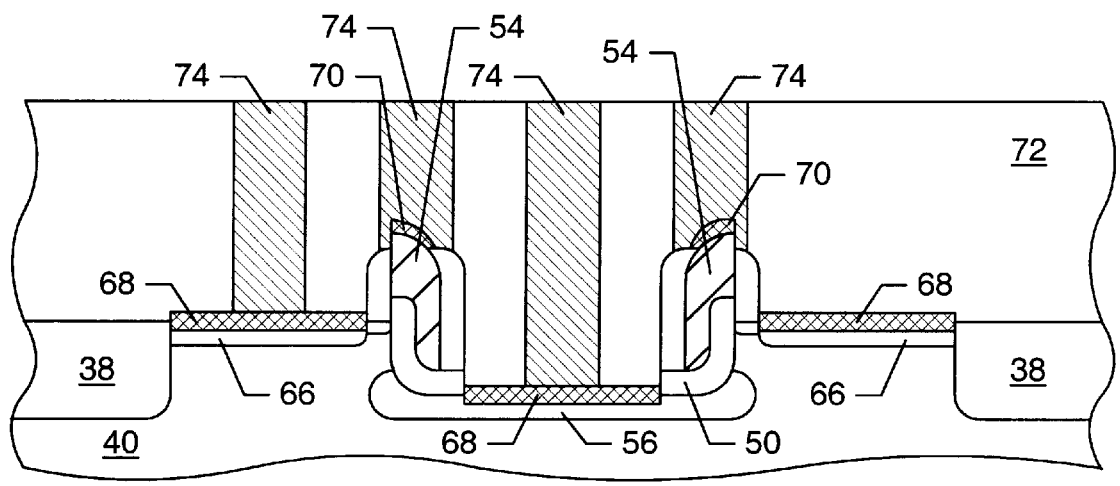
FIG. 13 is a partial cross-sectional view of the semiconductor topography, wherein metal silicide has been formed between overlying conductive plugs and the source region, the drain regions, and the gate conductors, respectively, subsequent to the step in FIG. 12.

Another implant of dopant species which is self-aligned to the opposed sidewall surfaces of sidewall spacers 64 may then be performed to form heavily doped drain regions 66 of a pair of transistors. The dopant species is of the same type as the dopant species used for the LDD implant. The dose and energy of this implant are preferably higher than the dose and energy of the LDD implant, resulting in a dopant gradient in the drain junctions. However, it may be necessary to maintain the implant energy below that of the source implant in order to prevent heavily doped drain junctions 66 from extending to the underlying source region 56. Otherwise, drain junctions 66 might approach source region 56, and thereby pinch off the channel region. The implant which forms heavily doped drain regions 66 has minimal effect on the pre-existing heavily doped source region 56. As such, source region 56 experiences little, if any, dopant profile gradient relative to the graded drain junctions. The resulting transistors includes a channel region interposed between source region 56 and each drain region 66. The physical channel length, L, of the vertically oriented channels is thus dictated by the depth of the trench. Each channel region is spaced from a gate conductor 54 by a gate dielectric 50. Turning to FIG. 13, self-aligned silicide "salicide" structures 68 have been formed upon source region 56 and drain regions 66 by reacting a refractory metal, e.g., titanium or cobalt, with the silicon surfaces of substrate 40. Salicide structures 70 have also been formed upon the upper surfaces of gate conductors 54. An interlevel dielectric 72 composed of, e.g., a glass- or oxide-based material has been deposited across the semiconductor topography. Conductive plugs 74 comprising, e.g., aluminum, tungsten, or titanium, have been formed through interlevel dielectric 72 to salicide structures 68 and 70. Metal interconnect may subsequently be formed across interlevel dielectric 72 to couple different conductive plugs 74 together.

It will be appreciated to those skilled in the art having the benefit of this disclosure that this invention is believed to provide a method for forming a transistor in which the channel length is controlled by the depth of a trench etched into a semiconductor substrate, wherein a mutual source region of a pair of series-connected transistors is arranged underneath the trench. Further modifications and alternative embodiments of various aspects of the invention will be apparent to those skilled in the art in view of this description. For example, a second trench may be etched within the substrate between the sidewall surfaces of the first trench, and a trench isolation structure may be formed within the second trench to isolate ensuing source/drain regions formed within the substrate between the sidewall surfaces of the first trench and the sidewall surfaces of the second trench. It is intended that the following claims be interpreted to embrace all such modifications and changes and, accordingly, the specification and drawings are to be regarded in an illustrative rather than a restrictive sense.

What is claimed is:

1. An integrated circuit comprising:

a trench arranged within a semiconductor substrate;

a pair of gate dielectrics arranged upon a pair of opposed sidewall surfaces of the trench, wherein a first gate dielectric is arranged upon a first opposed sidewall surface and a second gate dielectric is arranged upon a second opposed sidewall surface;

a first gate conductor arranged within the trench and spaced from the first opposed sidewall surface of the trench by the first gate dielectric, wherein the first gate conductor comprises a first pair of opposed lateral surfaces;

a second gate conductor arranged within the trench and spaced from the second opposed sidewall surface of the trench by the second gate dielectric, wherein the second gate conductor comprises a second pair of opposed lateral surfaces; and dielectric sidewall spacers arranged upon the first pair of opposed lateral surfaces and the second pair of opposed lateral surfaces.

2. The integrated circuit of claim 1, wherein the first pair of opposed lateral surfaces comprises a first opposed lateral surface aligned to the first opposed sidewall surface of the trench and a second opposed lateral surface laterally spaced from the first gate dielectric; and the second pair of opposed lateral surfaces comprises a first opposed lateral surface aligned to the second opposed sidewall surface of the trench and a second opposed lateral surface laterally spaced from the second gate dielectric.

3. The integrated circuit of claim 1, further comprising a source region arranged within the substrate underneath the trench and extending beyond the opposed sidewall surfaces of the trench, wherein the source region is implanted with dopant species.

4. The integrated circuit of claim 3, further comprising lightly doped drain areas arranged within the substrate a spaced distance above the source region and underneath the dielectric sidewall spacers.

5. The integrated circuit of claim 4, further comprising heavily doped drain regions arranged within the substrate laterally adjacent the lightly doped drain areas.

6. The integrated circuit of claim 4, further comprising channel regions extending vertically between the lightly doped drain areas and the source region within the substrate.

7. The integrated circuit of claim 1, wherein the gate conductors comprise doped polysilicon, and wherein the gate dielectrics are further arranged upon a base of the trench.

8. The integrated circuit of claim 5, further comprising salicide formed on an upper surface of the source region.

9. The integrated circuit of claim 8, further comprising salicide formed on an upper surface of the drain region.

10. The integrated circuit of claim 9, further comprising salicide formed on an upper surface of the gate conductors.

11. The integrated circuit of claim 10, further comprising an interlevel dielectric deposited across the semiconductor substrate.

12. The integrated circuit of claim 11, further comprising conductive plugs formed through the interlevel dielectric to the salicided source and drain, wherein the conductive plugs comprise aluminum, tungsten or titanium.

13. The integrated circuit of claim 1, wherein the first pair of opposed lateral surfaces and the second pair of opposed lateral surfaces extend above an upper surface the semiconductor substrate.

14. The integrated circuit of claim 1, wherein the first gate conductor and the second gate conductor extend above an upper surface of the semiconductor substrate.

15. The integrated circuit of claim 1, wherein the dielectric sidewall spacers extend above an upper surface of the semiconductor substrate.

* * * * *